US008537624B2

(12) United States Patent
Bae

(10) Patent No.: US 8,537,624 B2
(45) Date of Patent: Sep. 17, 2013

(54) SEMICONDUCTOR MEMORY DEVICE AND METHOD OF OPERATING THE SAME

(75) Inventor: Ji-Hyae Bae, Icheon-si (KR)

(73) Assignee: Hynix Semiconductor Inc., Icheon (KR)

(*) Notice: Subject to any disclaimer, the term of this patent is extended or adjusted under 35 U.S.C. 154(b) by 82 days.

(21) Appl. No.: 13/347,447

(22) Filed: Jan. 10, 2012

(65) Prior Publication Data

US 2012/0182812 A1 Jul. 19, 2012

(30) Foreign Application Priority Data

Jan. 13, 2011 (KR) ........................ 10-2011-0003703

(51) Int. Cl.
*G11C 7/22* (2006.01)

(52) U.S. Cl.
USPC .................. 365/189.05; 365/195; 365/230.03

(58) Field of Classification Search
USPC .......................................................... 365/195
See application file for complete search history.

(56) References Cited

U.S. PATENT DOCUMENTS 5,805,501 A * 9/1998 Shiau et al. .............. 365/185.29
5,937,424 A * 8/1999 Leak et al. ..................... 711/103
6,502,196 B1 * 12/2002 Chang et al. .................. 713/324
7,349,245 B2 * 3/2008 Kim et al. ..................... 365/158

FOREIGN PATENT DOCUMENTS

KR 10-2000-0033771 A 6/2000

* cited by examiner

*Primary Examiner* — Tan T. Nguyen

(57) ABSTRACT

A semiconductor memory device that may perform a second operation during a first operation comprises a command decoder for generating a decoded command signal, a suspend pulse and a resume pulse, and a storage unit for storing the decoded address signal, the decoded command signal and a data signal in response to the suspend pulse and providing the decoded address signal, the decoded command signal and the decoded data signal as a stored address signal, a stored command signal and a stored data signal, respectively, in response to the resume pulse.

14 Claims, 5 Drawing Sheets

SEMICONDUCTOR MEMORY DEVICE AND METHOD OF OPERATING THE SAME

CROSS-REFERENCE TO RELATED APPLICATION

The priority of Korean patent application No. 10-2011-0003703 filed on Jan. 13, 2011 the disclosure of which is hereby incorporated in its entirety by reference, is claimed.

BACKGROUND OF THE INVENTION

Embodiments of the present invention relate to a semiconductor memory device, and more particularly to a semiconductor memory device capable of suspending a particular operation in progress to perform another operation and a method of operating the same.

In general, a semiconductor memory device is configured to perform various operations such as a program operation, an erase operation, a read operation and a write operation. At any point in time, a memory cell array included in the semiconductor memory device may perform only one of the operations. Therefore, if a command signal for suspending a first operation that the semiconductor memory device is performing is inputted to perform a second operation, the first operation may be suspended although the first operation is not completed, and the second operation may be performed.

In this case, since the second operation is performed while the first operation has not been completed, the semiconductor memory device may lose information for the previously performed operation such as which parts of operation has already been performed, which memory cells the first operation was performed on, and which data was inputted or outputted.

BRIEF SUMMARY OF THE INVENTION

Various embodiments of the invention are directed to providing a semiconductor memory device configured to perform a second operation while performing a first operation. The semiconductor memory device can store information for the first operation so that when the first operation is restarted, the suspended first operation may be performed with continuity by providing the stored information, which improves reliability and operation efficiency of the semiconductor memory device.

According to an example embodiment of the present invention, a semiconductor memory device comprises a command decoder and a storage unit. The command decoder generates a decoded command signal to perform a first operation, a suspend signal and a resume signal based on a command signal. The storage unit stores information for an operation status of the first operation in response to the suspend signal and outputs the stored information in response to the resume signal. The suspend signal is activated to suspend the first operation when a second operation is requested to be performed while the first operation is performed.

For example, the information comprises a decoded address signal, the decoded command signal and a data signal.

For example, the semiconductor memory device may further comprise a memory cell array including a plurality of memory cells. The first operation corresponding to the decoded command signal is performed on a memory cell designated by the decoded address signal, thereby transmitting the data signal.

The semiconductor memory device may comprise a control unit for generating the command signal and the data signal based on external commands and external data.

The command signal may include a suspend request signal and a resume request signal, and the command decoder generates the suspend signal in response to the suspend request signal and the resume signal in response to the resume request pulse.

The command decoder may include a status register for storing operation information during the first operation, and the control unit generates a command reset signal for initializing the status register in response to the suspend request signal. For example, the operation information may comprise status information.

The storage unit may include a data input unit, a data latch unit and a data output unit. The data input unit transmits one or more of the decoded command signal, the decoded address signal and the data signal in response to the suspend signal. The data latch unit stores the one or more of the decoded command signal, the decoded address signal and the data signal. The data output unit outputs the one or more of the decoded command signal, the decoded address signal and the data signal stored in the data latch unit as a stored command signal, a stored address signal and a stored data signal in response to the resume signal.

The storage unit may include a first storage unit for storing the decoded address signal in response to the suspend signal and outputting the storage address signal in response to the resume signal, a second storage unit for storing the decoded command signal in response to the suspend signal and outputting the storage command signal in response to the resume signal; and a third storage unit for storing the data signal in response to the suspend signal and outputting the storage data signal in response to the resume signal.

For example, when the first operation or the second operation or both are erase operations, the resume request signal is not received.

According to an example embodiment of the present invention, a method of operating a semiconductor memory device comprises providing first signals required to perform a first operation, performing the first operation based on the first signals, storing the first signals in case of receiving a suspend request signal during the first operation being performed, providing second signals required to perform a second operation, performing the second operation based on the second signals, outputting the stored first signals in case of receiving a resume request signal after the second operation is completed, and completing the first operation based on the stored first signals.

According to some example embodiments, the resume request signal is not received when the first operation or the second operation, or both are erase operations.

The method according to an example embodiments, any further comprise initializing a status register when the suspend request signal is received.

For example, each of the first signals and the second signals comprises a command signal, an address signal and a data signal.

DESCRIPTION OF EMBODIMENTS

Embodiments of the present invention will be described in detail with reference to the attached drawings.

Figure 1:
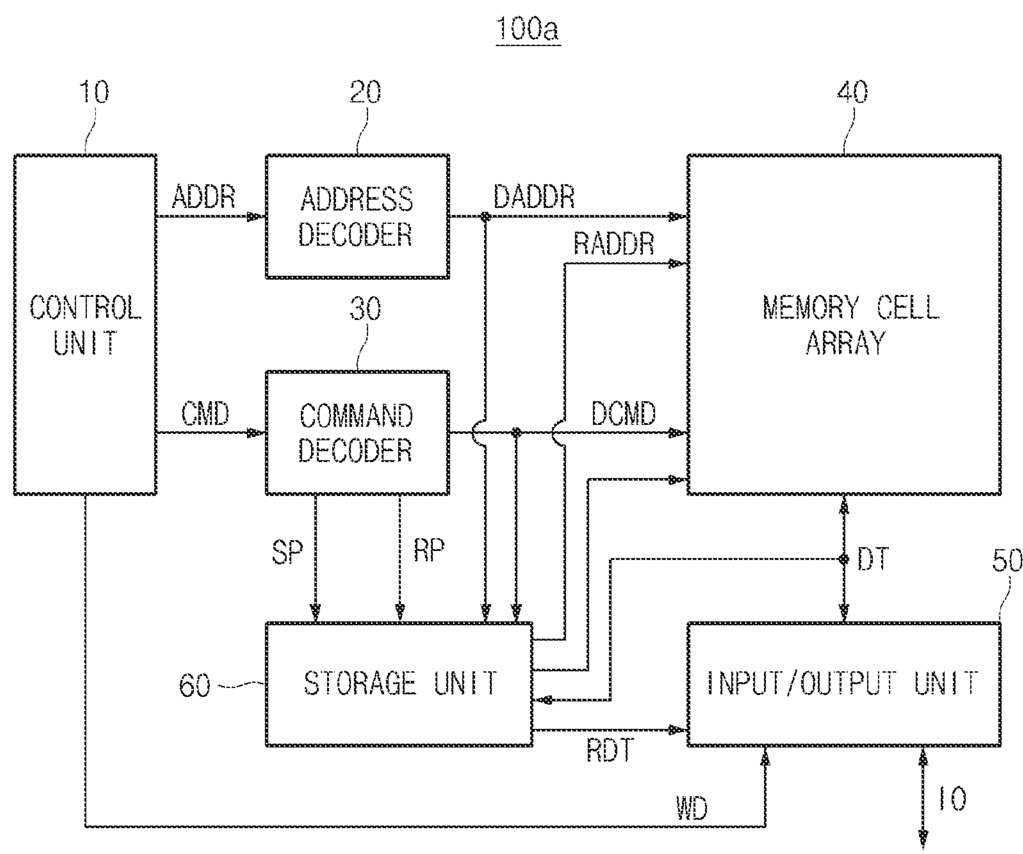
FIG. 1 is a block diagram illustrating a semiconductor memory device according to an example embodiment of the present invention.

FIG. 1 is a block diagram illustrating a semiconductor memory device according to an example embodiment of the present invention.

Referring to FIG. 1, the semiconductor memory device 100*a* includes a control unit 10, an address decoder 20, a command decoder 30, a memory cell array 40, an input/output (I/O) unit 50 and a storage unit 60.

The control unit 10 can communicate with external devices such as a host and control the whole operation of the semiconductor memory device 100*a*. The control unit 10 generates an address signal ADDR and a command signal CMD. The address signal ADDR may include a signal for designating a specific location of memory cells for performing a specific operation, and the command signal CMD may include at least one of a write enable signal WE, a read enable signal RE, a suspend request signal and a resume request signal.

The address decoder 20 provides a decoded address signal DADDR based on the address signal ADDR. The decoded address signal DADDR is provided to the memory cell array 40 and the storage unit 60. The decoded address signal DADDR that includes a row address and a column address represent a location of a specific cell in the memory cell array 40.

The command decoder 30 provides a decoded command signal DCMD based on the command signal CMD. The command signal CMD may not directly activate the specific operation, but the decoded command signal DCMD obtained by combining at least one command signal may activate the specific operation. As a result, the specific operation can be performed on the memory cell array 40 in response to the decoded command signal DCMD.

The command decoder 30 generates a suspend signal SP or a resume signal RP. In an embodiment of the present invention, while performing the specific operation, e.g., a first operation, the semiconductor memory device 100*a* can perform another operation, e.g., a second operation, after suspending the first operation. After the second operation is completed, the suspended first operation may be resumed.

For example, while the semiconductor memory device 100*a* performs the first operation, the control unit 10 may provide a command signal CMD for requesting suspension of the first operation to the command decoder 30 based on commands from external devices. In an embodiment of the present invention, the command decoder 30 may include a status register for storing operation information during the first operation, and the control unit 10 generates a command reset signal for initializing the status register in response to the suspend request signal. The command decoder 30 generates a suspend signal SP to suspend the first operation. At this time, the control unit 10 does not provide an address signal ADDR, a command signal CMD and a data signal DT with respect to the first operation so that operations with regard to the first operation in the address decoder 20, the memory cell array 40, and the I/O unit 50 are temporarily suspended. After the first operation of the semiconductor memory device 100*a* is suspended, the control unit 10 provides a command signal CMD for performing the second operation so that the command decoder 30 provides the decoded command signal DCMD to the memory cell array 40. An address signal ADDR and a write data WD with respect to the second operation may be newly provided.

After the second operation is completed, a command storage apparatus such as the status register included in the command decoder 30 may be initialized in response to the command reset signal. For example, the status register may store information that represents an operation status for the first operation performed in the semiconductor memory device 100*a*, for example, a status bit (or status information). Since the semiconductor memory device 100*a* is required to perform the first operation again, which had been suspended before the second operation was performed, the command decoder 30 generates a resume signal RP in response to a command signal CMD corresponding to a request for resuming the first operation, which is supplied from the control unit 10. When a command signal CMD for performing the first operation is provided to the command decoder 30 again, if there is no information for the first operation that was previously performed, the first operation cannot be properly resumed since it is difficult to exactly know the previous operation status of the first operation.

Thus, the semiconductor memory device 100*a* according to an embodiment of the present invention includes the storage unit 60 for storing information for the previous operation status of the first operation that is suspended.

The storage unit 60 stores the decoded address signal DADDR, the decoded command signal DCMD and the data signal DT in response to the suspend signal SP received from the command decoder 30. In other words, the storage unit 60 stores the decoded address signal DADDR, the decoded command signal DCMD, and the data signal DT, which have been provided with respect to the first operation before the command signal CMD for requesting the suspend as for the first operation is generated. The storage unit 60 stores the information for the first operation when the first operation is suspended and provides the stored information to internal circuits related to performing the first operation when the first operation is resumed after the second operation is completed.

The second operation may be performed based on the address signal ADDR, the command signal CMD and the data signal DT received from the control unit 10.

In accordance with embodiments of the present invention, the storage unit 60 may provide a stored address signal RADDR to the address decoder 20 or the memory cell array 40. In a similar manner, the storage unit 60 may provide a stored command signal RCMD to the command decoder 30 or the memory cell array 40 in response to the resume signal RP, and it may provide a stored data signal RDT to the I/O unit 50 or the memory cell array 40. For example, FIG. 1 shows that the stored address signal RADDR and the stored command signal RCMD are provided to the memory cell array 40 and the stored data signal RDT is provided to the I/O unit 50.

Since the semiconductor memory device 100*a* includes the storage unit 60 for storing the information for the first operation which was previously performed although the first operation is suspended and then resumed, it is possible to improve the efficiency of the first operation.

The memory cell array 40 that includes a plurality of memory cells performs an operation, which is designated in response to the decoded command signal DCMD or the stored command signal RCMD, on memory cells located at a position designated by the decoded address signal DADDR or the stored address signal RADDR. Also, the memory cell array 40 receives the data signal DT or the stored data signal RDT to store/write data or read data for output.

The I/O unit 50 coupled with a plurality of bit lines included in the memory cell array 40 provides the data signal DT received from the memory cell array 40 as an I/O signal 10 to the exterior or provides the data signal DT to the memory cell array 40 based on the write data WD.

Figure 2:
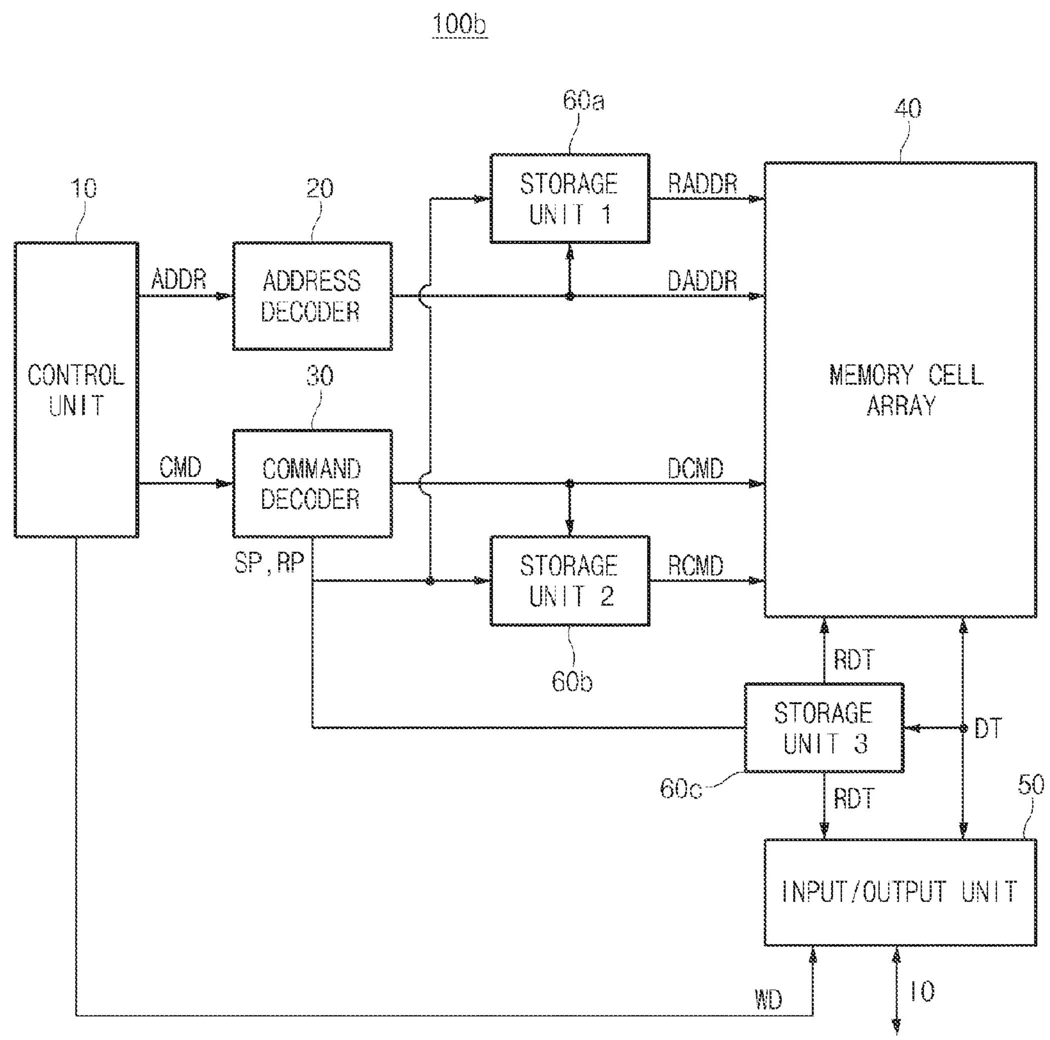
FIG. 2 is a block diagram illustrating a semiconductor memory device according to an example embodiment of the present invention.

FIG. 2 is a block diagram illustrating a semiconductor memory device according to an example embodiment of the present invention.

Referring to FIG. 2, the semiconductor memory device 100*b* includes a control unit 10, an address decoder 20, a command decoder 30, a memory cell array 40, an I/O unit 50 and first to third storage units 60*a*, 60*b* and 60*c*.

Compared with the semiconductor memory device 100*a* of FIG. 1, the semiconductor memory device 100*b* includes a plurality of storage units, e.g., the first to third storage units 60*a*, 60*b* and 60*c*. Accordingly, in FIGS. 1 and 2, the same reference numbers are used for components that have substantially the same configuration and perform substantially the same operation. Thus, the specific explanation of these components will be omitted.

The first to third storage units 60*a*, 60*b* and 60*c* stores a decoded address signal DADDR, a decoded command signal DCMD and a data signal DT, respectively, in response to a suspend signal SP and provides a stored address signal RADDR, a stored command signal RCMD and a stored data signal RDT, respectively, in response to a resume signal RP. Although the first to third storage units 60*a*, 60*b* and 60*c* are shown in FIG. 2, the present invention will not be limited thereto. In accordance with an embodiment of the present invention, the semiconductor memory device may include more or less than three storage units depending on information to be stored with respect to a suspended operation.

Referring back to FIG. 2, the first to third storage units 60*a*, 60*b* and 60*c* operate in substantially the same manner as the storage unit 60 in FIG. 1.

The first storage unit 60*a* stores the decoded address signal DADDR in response to the suspend signal SP and outputs the stored address signal RADDR in response to the resume signal RP.

The second storage unit 60*b* stores the decoded command signal DCMD in response to the suspend signal SP and outputs the stored command signal RCMD in response to the resume signal RP.

The third storage unit 60*c* stores the data signal DT in response to the suspend signal SP and outputs the stored data signal RDT in response to the resume signal RP.

The first to third storage units 60*a*, 60*b* and 60*c* may be used as temporary storage units. Moreover, the semiconductor memory device 100*b* may include storage units that can be simply embodied for storing information with respect to suspended operations and outputting the stored information at a resume point of time so as to complete the suspended operations with continuity and to resume the suspended operation not from the initial status but from the previous status. As a result, it is possible to improve the reliability and efficiency of the whole operation of the semiconductor device 100*b*.

However, according to an embodiment of the present invention, in a non-volatile memory device, when a program operation is performed after an erase operation is suspended, the resume signal RP may not be generated. Also, when the erase operation is performed while the program operation is performed, the resume signal RP for resuming the program operation may not be generated. The generation of the resume signal RP (as for the relation between the operations) is controlled by the command signal CMD, and it may be followed by previously set rules or set in a different manner by a user.

Figure 3:
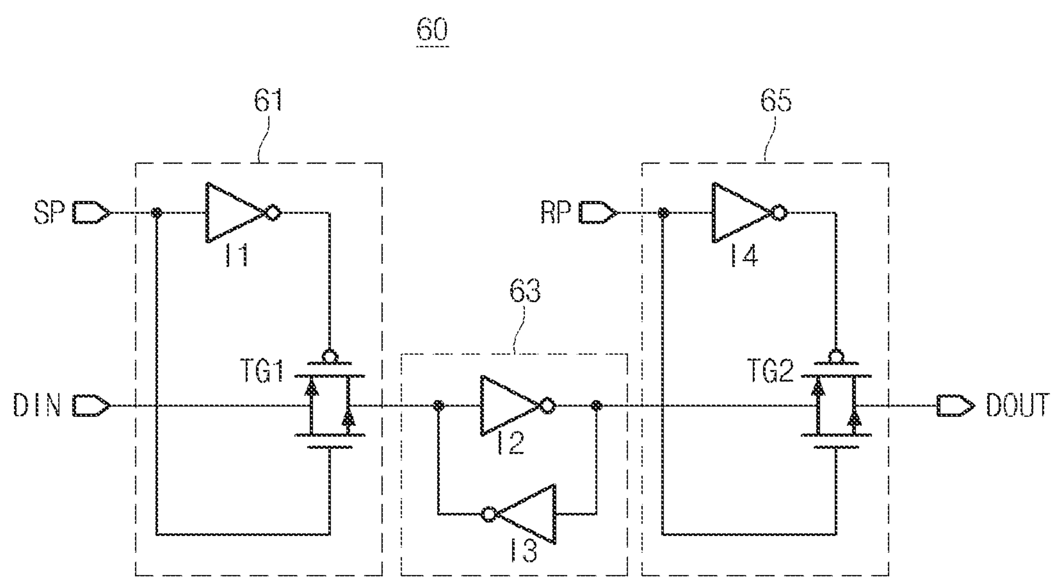
FIG. 3 is a circuit diagram illustrating a storage unit included in the semiconductor memory devices of FIGS. 1 and 2.

FIG. 3 is a circuit diagram illustrating a storage unit included in the semiconductor memory devices of FIGS. 1 and 2. The circuit diagram of FIG. 3 may correspond to the configuration of each of the plurality of storage units 60, 60*a*, 60*b* and 60*c* and use different reference numbers to include each element.

Referring to FIG. 3, the storage unit 60 includes a data input unit 61, a data latch unit 63, and a data output unit 65.

The data input unit 61 provides a data input signal DIN to the data latch unit 63 in response to the suspend signal SP. The data input signal DIN may include the decoded address signal DADDR, the decoded command signal DCMD, and the data signal DT.

The data input unit 61 includes a first inverter I1 and a first transmission gate TG1. The first transmission gate TG1 delivers the data input signal DIN to the data latch unit 63 in response to the suspend signal SP.

The data latch unit 63 includes a second inverter I2 and a third inverter I3, and stores the data input signal DIN.

The data output unit 65 outputs the data input signal DIN stored in the data latch unit 63 as a data output signal DOUT in response to the resume signal RP. The data output signal DOUT may include the stored address signal RADDR, the stored command signal RCMD, and the stored data signal RDT. The data input signal DIN and the data output signal DOUT have substantially the same values. For example, the decoded command signal DCMD while the semiconductor memory device 100*a* or 100*b* performs the first operation represents a signal with respect to the first operation. However, when the first operation is suspended by the suspend signal SP and the command signal CMD is initialized after the second operation is completed, the decoded command signal DCMD does not represent any operation. Therefore, to distinguish it from the decoded command signal DCMD after the initialization of the command signal CMD, the signal output from the storage unit 60 is named as the stored command signal RCMD.

The data output unit 65 includes a fourth inverter I4 and a second transmission gate TG2. The second transmission gate TG2 outputs the data input signal DIN stored in the data latch unit 63 as the data output signal DOUT in response to the resume signal RP.

Figure 4:
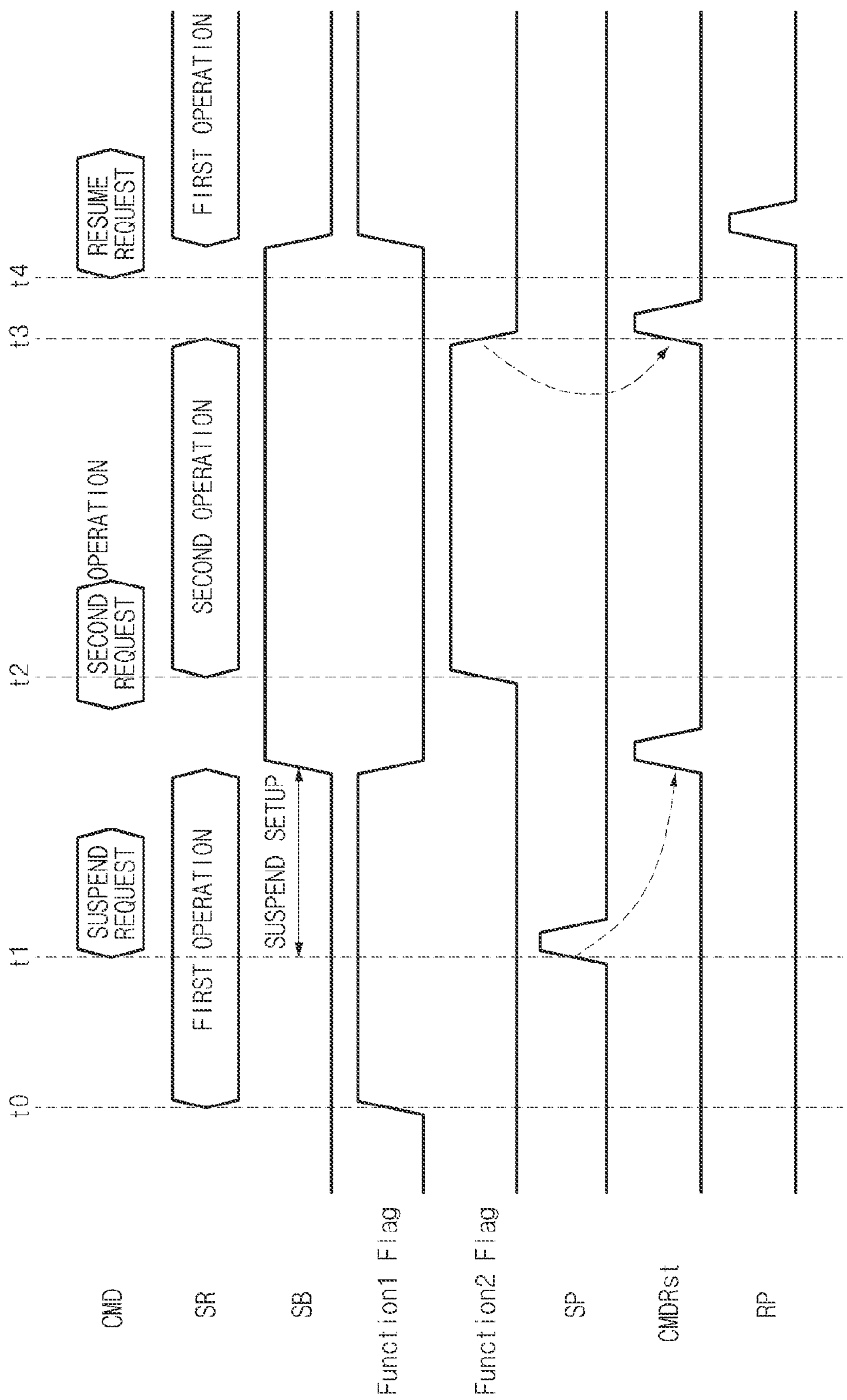
FIG. 4 is a timing diagram illustrating an operation of the semiconductor memory device shown in FIG. 1 or FIG. 2 according to an embodiment of the present invention.

FIG. 4 is a timing diagram illustrating an operation of the semiconductor memory device shown in FIG. 1 or FIG. 2 according to an embodiment of the present invention.

Referring to FIG. 4, 'CMD' represents a command signal, and 'SR' represents an operation performed by the semiconductor memory device 100*a* or 100*b* and also represents status information stored in a status register. The signal 'SB', which represents a status bit for suspending an ongoing operation, e.g., a first operation, may be enabled in response to a suspend request by the command signal CMD. The signal 'Function 1 Flag' is a flag signal generated for performing the first operation, and 'Function 2 Flag' is a flag signal generated for performing an operation, e.g., a second operation, performed after suspending the first operation. The signals 'Function 1 Flag' and 'Function 2 Flag' may be generated by the command decoder 30 based on the command signal CMD. The signal 'SP', which is a suspend signal, and 'CMDRst', which is a command reset signal for initializing the command signal CMD, may be generated by the control unit 10. The signal 'RP' represents a resume signal.

Referring back to FIG. 4, at a time t0, Function 1 Flag is enabled to perform the first operation. Before time t0, a command signal CMD for requesting the first operation may be provided. At time t1 while the first operation is being performed, a command signal CMD for requesting the suspension of the first operation is provided, and the command decoder 30 enables the suspend signal SP. In response to the enabled suspend signal SP, the suspend status bit SB is enabled after a suspend setup time elapsed, and Function 1 Flag is disabled so that the first operation is suspended and so that the command reset signal CMDRst is enabled. Since the semiconductor memory device 100*a* or 100*b* stores in the storage unit information about when the first operation is performed, an address of a memory cell where the first operation is performed, and its related data, the semiconductor memory device 100*a* or 100*b* can perform the first operation by obtaining the information about when the first operation is performed and its related data at a time when the first operation is resumed although the command signal CMD is initialized.

Around a time t2 after the suspension for the first operation is completed, a command signal CMD for requesting a second operation is provided to perform the second operation. Function 2 Flag is enabled, and the control unit 10 provides the address signal ADDR and the data signal DT for the second operation to perform a read or write operation resulting from the second operation in the memory cell array 40.

At time t3, the second operation is completed, and Function 2 Flag is disabled so that the command reset signal CMDRst is enabled to initialize the command signal CMD. Since the command signal CMD is initialized, the control unit 10 generates a command signal CMD for requesting the resumption of the first operation at time t4. As a result, the command decoder 30 enables the resume signal RP to resume the first operation. When the first operation is resumed, the storage unit 60 outputs the stored decoded address signal DADDR as the stored address signal RADDR, the decoded command signal DCMD as the stored command signal RCMD, and the data signal DT as the stored data signal RDT. In an embodiment, if the first operation does not require additional write data WD like the erase operation, the stored data signal RDT may not be provided.

Thus, when the second operation is requested to be performed while the first operation is being performed, the semiconductor memory device 100*a* or 100*b* according to the embodiment of the present invention includes a storage unit to store information about the first operation so as to perform the first operation continuously after the second operation is completed.

Figure 5:
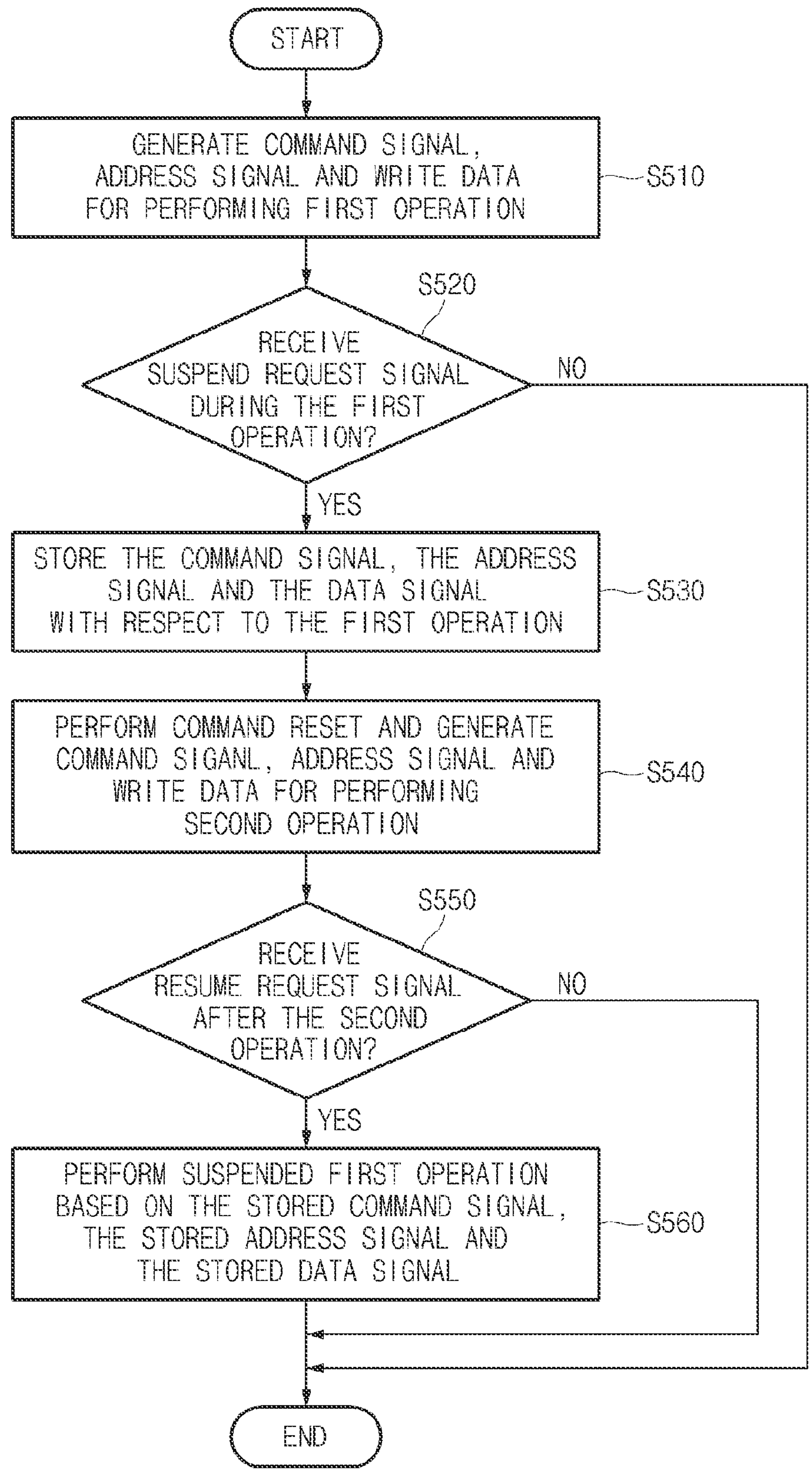
FIG. 5 is a flow chart illustrating a method of operating the semiconductor memory device shown in FIG. 1 or FIG. 2 according to an embodiment of the present invention.

FIG. 5 is a flow chart illustrating a method of operating the semiconductor memory device shown in FIG. 1 or FIG. 2 according to an embodiment of the present invention.

Referring to FIG. 5, in the method of operating the semiconductor memory device, the control unit 10 generates the command signal CMD, the address signal ADDR and the write data WD to perform the first operation at step S510.

The control unit 10 receives a command from an external device to provide the command signal CMD for requesting the first operation in order to perform the first operation. Also, the control unit 10 provides the address signal ADDR for designating a specific cell in the memory cell array 40 for performing the first operation on the specific cell and the write data WD when the first operation is a program operation.

Before the first operation is completed, that is, while the first operation is ongoing, the control unit 10 provides a suspend request signal to the command decoder 30. When the control unit 10 receives a suspend request or a second operation request signal from the external device, the control unit 10 may generate the suspend request signal and the command decoder 30 may generate the suspend signal SP in response to the suspend request signal.

When the suspend request signal is received during the first operation at step S520, the command decoder 30 generates the suspend signal SP so that the data signal DT, the address signal ADDR and the write data WD as for the first operation may be stored in the storage unit 60 at step S530. The signals stored in the storage unit 60 may be decoded signals.

If a command signal CMD for requesting the second operation is not received during the first operation at step S520, after the first operation is completed, the semiconductor memory device may terminate its operation or perform another operation after the completion of the first operation.

When a status register is included in the command decoder 30 to store a current operation status of the semiconductor memory device, the status bit SB is initialized in response to the command reset signal CMDRst and the information for the first operation is initialized. After the command is reset, the control unit 10 generates the command signal CMD, the address signal ADDR and the write data WD with respect to the second operation to provide them to the command decoder 30, the address decoder 20, and the I/O unit 50, respectively, at step S540.

After the second operation is completed, the control unit 10 generates a resume request signal for performing the first operation again to the command decoder 30 if it is determined that the first operation is required to be resumed at step S550. On the other hand, if it is determined that the first operation is not required to be resumed after the second operation is completed at step S550, the control unit 10 does not generate the resume request signal, and the first operation may not be performed again.

The command decoder 30 generates the resume signal RP in response to the resume request signal, and the storage unit 60 outputs the stored signals as the stored command signal RCMD, the stored address signal RADDR, and the stored data signal RDT, respectively, in response to the resume signal RP.

After that, the semiconductor memory device performs the first operation, which is represented by the stored command signal RCMD, on a memory cell designated by the stored address signal RADDR to read out/write the stored data signal RDT of/in the memory cell at step S560.

The above some embodiments of the present invention are illustrative and do not limit the scope of the present invention. Various alternatives and equivalents are possible. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A semiconductor memory device comprising:

a command decoder configured to generate a decoded command signal to perform a first operation, a suspend signal, and a resume signal based on a command signal; and a storage unit configured to store information for an operation status of the first operation in response to the suspend signal and to output the stored information in response to the resume signal, wherein the suspend signal is activated to suspend the first operation when a second operation is requested to be performed while the first operation is being performed, and wherein the resume signal is activated to resume the first operation after the second operation is completed.

2. The semiconductor memory device according to claim 1, wherein the information comprises a decoded address signal, the decoded command signal and a data signal.

3. The semiconductor memory device according to claim 2, further comprising:

a memory cell array including a plurality of memory cells, wherein the first operation corresponding to the decoded command signal is performed on a memory cell designated by the decoded address signal, thereby transmitting the data signal.

4. The semiconductor memory device according to claim 2, further comprising:

a control unit configured to generate the command signal and the data signal based on external commands and external data.

5. The semiconductor memory device according to claim 2, wherein the command signal comprises a suspend request signal and a resume request signal, and the command decoder generates the suspend signal in response to the suspend request signal and the resume signal in response to the resume request signal.

6. The semiconductor memory device according to claim 5, wherein the command decoder comprises a status register for storing operation information during the first operation, and the control unit generates a command reset signal for initializing the status register in response to the suspend request signal.

7. The semiconductor memory device according to claim 6, wherein the operation information comprises status information.

8. The semiconductor memory device according to claim 2, wherein the storage unit comprises:

a data input unit configured to transmit one or more of the decoded command signal, the decoded address signal, and the data signal in response to the suspend signal;

a data latch unit configured to store the one or more of the decoded command signal, the decoded address signal, and the data signal; and a data output unit configured to output the one or more of the decoded command signal, the decoded address signal, and the data signal stored in the data latch unit as a stored command signal, a stored address signal, and a stored data signal, respectively, in response to the resume signal.

9. The semiconductor memory device according to claim 2, wherein the storage unit comprises:

a first storage unit configured to store the decoded address signal in response to the suspend signal and to output a stored address signal in response to the resume signal;

a second storage unit configured to store the decoded command signal in response to the suspend signal and to output a stored command signal in response to the resume signal; and a third storage unit configured to store the data signal in response to the suspend signal and to output a stored data signal in response to the resume signal.

10. The semiconductor memory device according to claim 5, wherein the resume request signal is not received when the first operation or the second operation, or both are erase operations.

11. A method of operating a semiconductor memory device, the method comprising:

providing first signals required to perform a first operation;

performing the first operation based on the first signals;

storing the first signals when a suspend request signal is received during the first operation being performed;

providing second signals required to perform a second operation;

performing the second operation based on the second signals;

outputting the stored first signals when a resume request signal is received after the second operation is completed; and completing the first operation based on the stored first signals.

12. The method according to claim 11, wherein the resume request signal is not received when the first operation or the second operation, or both are erase operations.

13. The method according to claim 11, further comprising:

initializing a status register when the suspend request signal is received.

14. The method according to claim 11, wherein each of the first signals and the second signals comprises a command signal, an address signal and a data signal.

* * * * *